US008373722B2

(12) United States Patent
Hibi et al.

(10) Patent No.: US 8,373,722 B2

(45) Date of Patent: Feb. 12, 2013

(54) COLOR MEASURING APPARATUS AND METHOD AND LIQUID CRYSTAL DISPLAY SYSTEM

(75) Inventors: Kenichiro Hibi, Toyokawa (JP); Kazuya Kiyoi, Tondabayashi (JP)

(73) Assignee: Konica Minolta Sensing, Inc., Osaka (JP)

( * ) Notice: Subject to any disclaimer, the term of this patent is extended or adjusted under 35 U.S.C. 154(b) by 486 days.

(21) Appl. No.: 12/754,093

(22) Filed: Apr. 5, 2010

(65) Prior Publication Data

US 2010/0259555 A1 Oct. 14, 2010

(30) Foreign Application Priority Data

Apr. 10, 2009 (JP) ................................ 2009-096487

(51) Int. Cl.

| | |
|---|---|
| ***G09G 3/30*** | (2006.01) |
| ***G09G 5/00*** | (2006.01) |
| ***G09G 5/02*** | (2006.01) |
| ***G09G 5/36*** | (2006.01) |
| ***H04N 17/00*** | (2006.01) |
| ***H04N 9/04*** | (2006.01) |
| ***H04N 5/46*** | (2006.01) |
| ***H04N 5/63*** | (2006.01) |
| ***H04N 1/46*** | (2006.01) |
| ***G03F 3/08*** | (2006.01) |
| ***G02F 1/13*** | (2006.01) |
| ***G06K 9/40*** | (2006.01) |
| ***G06K 9/00*** | (2006.01) |
| *G02F 1/1335* | (2006.01) |
| *G06K 9/20* | (2006.01) |

(52) U.S. Cl. ........ 345/601; 345/547; 345/591; 345/207; 345/77; 345/690; 348/180; 348/273; 348/557; 348/730; 349/1; 349/106; 358/504; 358/512; 358/518; 358/523; 382/167; 382/254; 382/260; 382/274; 382/312

(58) Field of Classification Search .................. 345/581, 345/589–593, 600–604, 606, 618–619, 657, 345/548–549, 204, 207, 690, 22, 32, 38, 345/48, 63, 77, 87–88; 348/68–71, 180, 348/184, 253–254, 268–270, 272–273, 383, 348/557, 602, 607, 683, 687, 708, 712, 761, 348/786, 790–791, 835; 358/504, 509, 512, 358/515, 518–520, 523–525; 382/162, 167, 382/254, 260, 274, 276, 297–300, 305, 312; 340/1, 69–70, 72, 104–106

See application file for complete search history.

(56) References Cited

U.S. PATENT DOCUMENTS 6,657,712 B2 12/2003 Yamaguchi (Continued)

FOREIGN PATENT DOCUMENTS

| | | |
|---|---|---|
| JP | 11-132849 | 5/1999 |
| JP | 2003-294528 A | 10/2003 |
| JP | 2007-093477 | 4/2007 |

OTHER PUBLICATIONS

Reasons for Rejection (Office Action) for Japanese Patent Application No. 2009-096487dated Oct. 2, 2012, including an English language translation, 5 pages.

*Primary Examiner* — Wesner Sajous

(74) *Attorney, Agent, or Firm* — Brinks Hofer Gilson & Lione

(57) ABSTRACT

According to color measuring apparatus and method and a liquid crystal display system S of the present invention, intensity signals obtained by receiving radiant light from a liquid crystal color display 3 at a first viewing angle and corresponding to at least three mutually different spectral responsivities are converted into information on a plurality of primary color intensities of the liquid crystal color display 3, and the intensity signals by the first viewing angle are corrected to signal intensities by a second viewing angle. Thus, these color measuring apparatus and method are capable of a more accurate measurement even at a dark gradation. The liquid crystal display system can more accurately calibrate a display surface 3*a* of the liquid crystal color display 3 even at a dark gradation.

10 Claims, 9 Drawing Sheets

U.S. PATENT DOCUMENTS

| | | | | |
|---|---|---|---|---|
| 2007/0067124 | A1 * | 3/2007 | Kimpe et al. | 702/67 |
| 2008/0130023 | A1 * | 6/2008 | Perez et al. | 358/1.9 |
| 2010/0231728 | A1 * | 9/2010 | Holub | 348/207.2 |
| 2010/0289835 | A1 * | 11/2010 | Holub | 345/690 |

* cited by examiner

FIG. 6

CORRECTION COEFFICIENT TABLE

| REFERENCE VALUE | | | CORRECTION COEFFICIENT | | |
|---|---|---|---|---|---|
| R | G | B | Kr | Kg | Kb |
| 0.0043 | 0.0042 | 0.0069 | 0.141 | 0.176 | 0.154 |
| 0.0245 | 0.0252 | 0.0341 | 0.281 | 0.291 | 0.261 |
| 0.0684 | 0.0754 | 0.0866 | 0.497 | 0.465 | 0.449 |
| 0.1308 | 0.1412 | 0.1557 | 0.674 | 0.628 | 0.629 |
| 0.2118 | 0.2264 | 0.2395 | 0.785 | 0.757 | 0.765 |
| 0.3258 | 0.3400 | 0.3586 | 0.843 | 0.833 | 0.850 |
| 0.8980 | 0.9292 | 0.9782 | 0.997 | 0.999 | 1.006 |

COLOR MEASURING APPARATUS AND METHOD AND LIQUID CRYSTAL DISPLAY SYSTEM

BACKGROUND OF THE INVENTION

1. Field of the Invention

The present invention relates to color measuring apparatus and method capable of suitably measuring color, for example, on a display surface of a liquid crystal display device.

The present invention also relates to a liquid crystal display system capable of color calibration on a display surface of a liquid crystal display device based on the color measured by the color measuring apparatus.

2. Description of the Background Art

Conventionally, CRT displays have been a mainstream of display devices, but devices adopting various methods such as liquid crystal displays (LCDs), plasma displays (PDPs) and organic EL displays have been developed in recent years and are spreading. Such a display device is required to be of a relatively high quality due to its intended use, for example, in applications such as printing application and medical application and a calibration process for calibrating luminance and chromaticity deviations is performed to satisfy this requirement.

Upon this calibration, luminance and chromaticity need to be measured and a luminance meter is used to measure luminance. Known luminance meters include telescopic luminance meters and contact luminance meters. A telescopic luminance meter is an apparatus for measuring the luminance of a display device from a position at a specified distance from the display device and includes an optical system inside. Since light in a limited range is condensed by this optical system, a measurement field is narrow. On the other hand, a contact luminance meter is an apparatus for performing a measurement while being held in contact with a display surface of a display device, and is so structured as to be usable while being attached to the display surface of the display device by means of a sucking disk or the like. A distance from the display surface of the display device to a light receiving sensor is short, no such optical system as to narrow a light receiving angle is provided in many cases for cost reduction and a measurement field is relatively wide.

A color sensor called a CRT calibrator produced by Konica Minolta Holdings, Inc is, for example, known as such a contact luminance meter. This CRT calibrator is roughly such that incident light is received by silicon photodiodes arranged in a one-to-one correspondence with color filters of X, Y and Z in the so-called CIE color systems via the respective color filters, light receiving outputs of the respective silicon photodiodes are converted by a current-to-voltage conversion circuit and an analog-to-digital conversion circuit, digital values corresponding to the respective silicon photodiodes are taken into a built-in microcomputer, a colorimetric value as a final output value is calculated based on these respective digital values while calibration is performed by this microcomputer and the colorimetric value is output.

In the case of measuring luminance on a display surface of a CRT display by such a luminance meter, substantially the same value is obtained regardless of whether the measurement is conducted by a telescopic luminance meter or by a contact luminance meter and an accurate measurement is possible since a luminance variation according to a viewing angle is relatively small and the viewing angle dependence of the luminance is small in the CRT display. However, the luminance largely varies according to the viewing angle and the viewing angle dependence of the luminance is large at gradations in a dark part of the liquid crystal display, wherefore no accurate measurement can be conducted by the contact luminance meter.

In order to accurately measure luminance on a display surface of a liquid crystal display using this contact luminance meter, there is a luminance measuring apparatus for liquid crystal display, for example, disclosed in Japanese Unexamined Patent Publication No. 2003-294528 (U.S. Pat. No. 6,657,712, D1). The luminance measuring apparatus for liquid crystal display disclosed in this document D1 is provided with a contact luminance meter, a light blocking cushion member surrounding a light receiver of the contact luminance meter, a light meter including a fixture for moderately pressing the light blocking cushion member against a display surface of the display and fixing the contact luminance meter to the liquid crystal display so that a facing direction of the light receiver of the contact luminance meter and that of the display have a fixed relationship, a converter for converting a luminance measurement result by the contact luminance meter into the one corresponding to a telescopic luminance meter based on the luminance measurement result by the contact luminance meter and that by the telescopic luminance meter, and a processor for converting the luminance measurement result by the light meter using the converter. The document D1 discloses that, by the above construction, the display luminance of the liquid crystal display can be accurately measured by the contact luminance meter as if it were measured by the telescopic luminance meter.

In the case of measuring the liquid crystal display, the above apparatus can measure bright gradations with relatively high accuracy, but cannot properly correct in the measurement at a dark gradation and it is difficult to measure with high accuracy since the viewing angle dependence of the liquid crystal display is large.

SUMMARY OF THE INVENTION

The present invention was developed in view of the above situation and an object thereof is to provide color measuring apparatus and method capable of more accurately measuring even at a dark gradation. Another object of the present invention is to provide a liquid crystal display system capable of calibrating color on a display surface of a liquid crystal color display based on the color measured by the color measuring apparatus.

According to color measuring apparatus and method and a liquid crystal display system of the present invention, intensity signals obtained by receiving radiant light from a liquid crystal color display at a first viewing angle and corresponding to at least three mutually different spectral responsivities are converted into information on a plurality of primary color intensities of the liquid crystal color display, and the intensity signals by the first viewing angle are corrected to signal intensities by a second viewing angle. Thus, these color measuring apparatus and method are capable of a more accurate measurement even at a dark gradation. The liquid crystal display system can more accurately calibrate a display surface of a liquid crystal color display even at a dark gradation.

These and other objects, features and advantages of the present invention will become more apparent upon reading the following detailed description along with the accompanying drawings.

BRIEF DESCRIPTION OF THE DRAWINGS

FIG. 6 is a table showing a correction coefficient table of the sensor unit in the liquid crystal display system shown in FIG. 1, FIG. 7 are graphs showing correction coefficient functions of the sensor unit in the liquid crystal display system shown in FIG. 1.

DETAILED DESCRIPTION OF THE PREFERRED EMBODIMENT OF THE INVENTION

Figure 1:
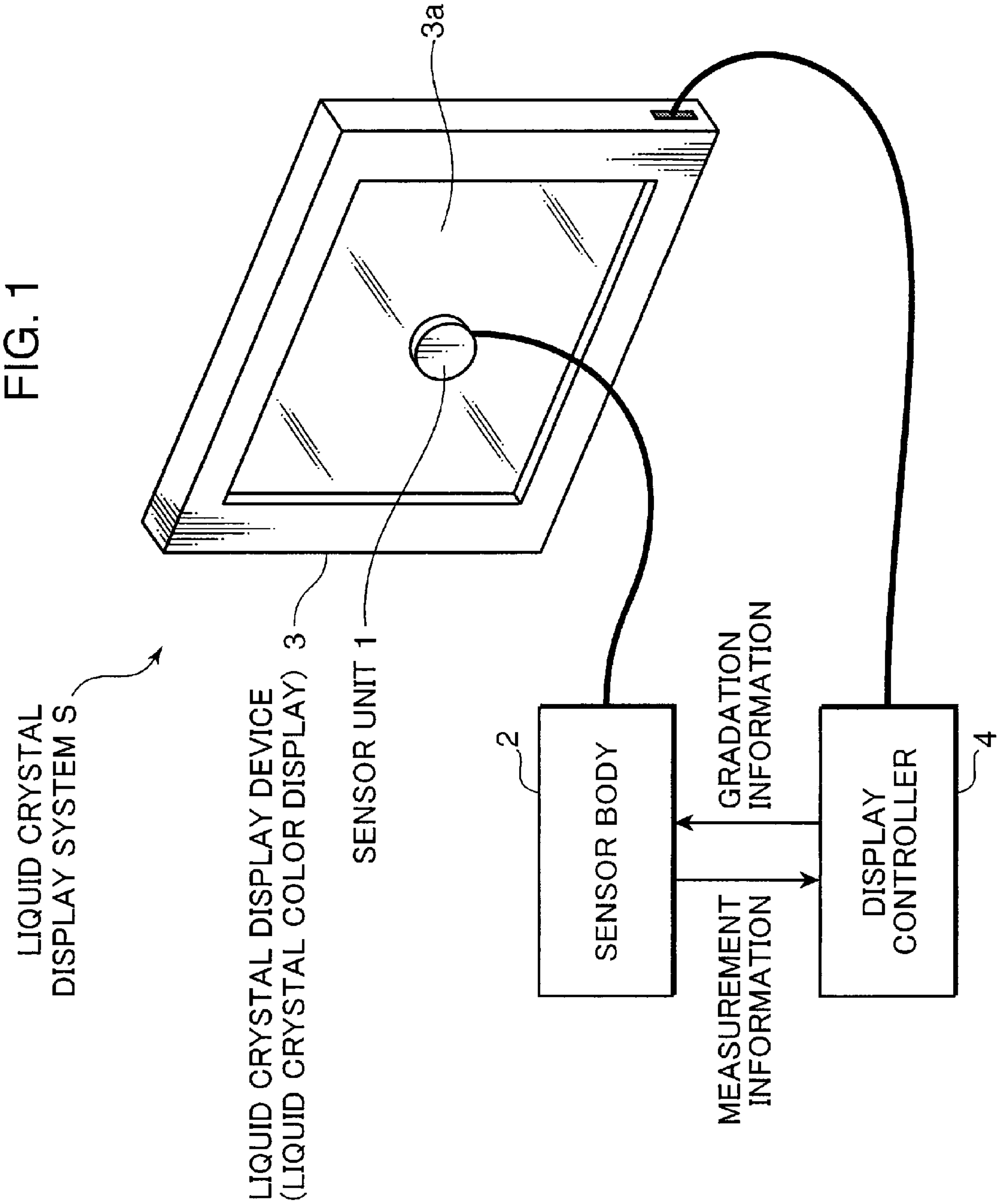
FIG. 1 is a diagram showing the external construction of a liquid crystal display system according to one embodiment of the invention.

Hereinafter, one embodiment of the present invention is described with reference to the accompanying drawings. Constructions identified by the same reference numerals in the respective drawings are identical and, accordingly, not repeatedly described.

Figure 2:
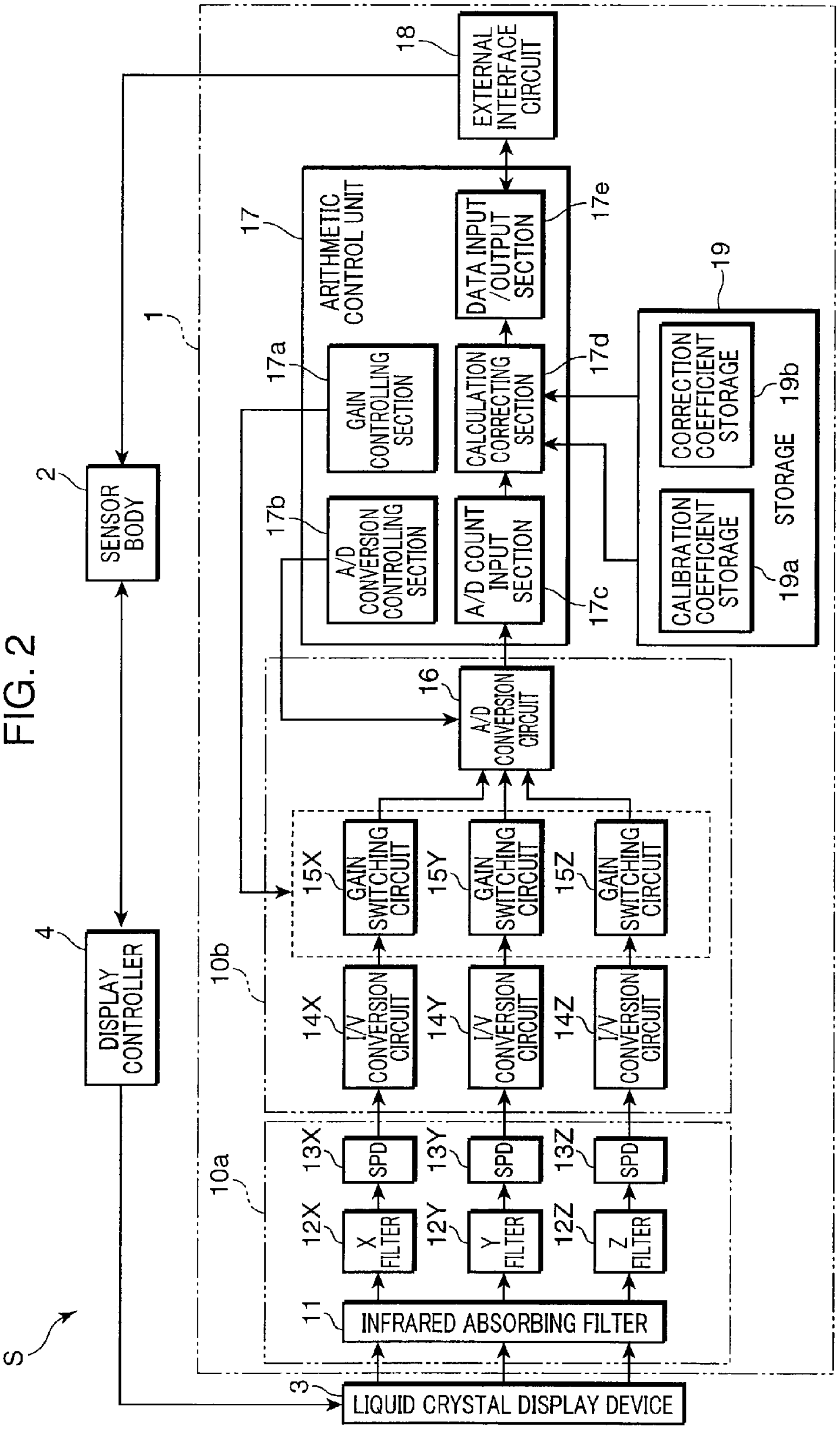
FIG. 2 is a block diagram showing the construction of the liquid crystal display system shown in FIG. 1.

FIG. 1 is a diagram showing the external construction of a liquid crystal display system according to the embodiment. FIG. 2 is a block diagram showing the construction of the liquid crystal display system according to the embodiment.

In FIG. 1, a liquid crystal display system S according to this embodiment is for adjusting the color (e.g. luminance and chromaticity) of a liquid crystal display device 3 and is provided with a color measuring apparatus for measuring color on a display surface 3*a* of the liquid crystal display device 3 and a display controller 4 for calibrating the color on the display surface 3*a* of the liquid crystal display device 3 based on a measurement result of the color measuring apparatus.

The liquid crystal display device (liquid crystal color display, color LCD) 3 is a liquid crystal color display device of a high quality which requires luminance and chromaticity calibrations.

The color measuring apparatus is for measuring the luminance or color of the liquid crystal display device 3 and provided with a light receiver for receiving radiant light from the liquid crystal display device 3 at a specified first viewing angle and outputting intensity signals corresponding to at least three mutually different spectral responsivities, a converter for converting the respective intensity signals output from the light receiver into information on a plurality of primary color intensities of the liquid crystal display device 3, and a corrector for correcting the intensity signals by the first viewing angle to those by a specified second viewing angle based on the information on the primary colors intensities and prestored conversion coefficients for the respective primary colors specific to the liquid crystal display device 3. In this embodiment, a correction coefficient storage is further provided to store the conversion coefficients for the respective primary colors specific to the liquid crystal display device 3 beforehand, and the corrector corrects the intensity signals by the first viewing angle to those by the second viewing angle by using the conversion coefficients stored in this correction coefficient storage. Further, in this embodiment, the light receiver includes, for example, an optical filter on which the radiant light from the liquid crystal display device 3 is incident and which output beams corresponding to at least three mutually different spectral responsivities, and a light receiving circuit for receiving the respective beams output from the optical filter and outputting intensity signals corresponding to the at least three different spectral responsivities.

More specifically, the color measuring apparatus is provided with the light receiver for outputting first to third spectral intensity signals relating to first to third light intensities of first to third spectra of incident light corresponding to mutually different first to third spectral distributions, an RGB converter for converting the first to third spectral intensity signals output from the light receiver into first to third signal values relating to RGB values of the liquid crystal display device 3 and the corrector for correcting the first to third signal values so as to correct an error caused by the viewing angle dependence of the liquid crystal display device 3. The light receiver is a color meter for outputting tristimulus values of the CIE color systems in the incident light and further includes a tristimulus value converter for converting the first to third signal values corrected by the corrector into tristimulus values of the CIE color systems. More specifically, the light receiver includes the optical filter for outputting the first to third spectra of the incident light corresponding to the mutually different first to third spectral distributions and the light receiving circuit for receiving the first to third spectra output from the optical filter and outputting the first to third spectral intensity signals relating to the first to third light intensities of the first to third spectra. The color measuring apparatus further includes the correction coefficient storage storing the correction coefficients, which are used to correct an error caused by the viewing angle dependence of the liquid crystal display device 3, beforehand. The corrector corrects the first to third signal values by using the correction coefficients stored in the correction coefficient storage. Such a color measuring apparatus includes, for example, a sensor unit 1 and a sensor body 2 in an example shown in FIGS. 1 and 2.

The sensor unit 1 is a sensor connected to the sensor body 2 for receiving light radiated from the display surface 3*a* of the liquid crystal display device 3 and measuring luminance Lv and chromaticity x, y, on the display surface 3*a* of the liquid crystal display device 3. The sensor unit 1 is attached to the display surface 3*a* of the liquid crystal display device 3, for example, by means of a sucking disk or the like at the time of calibration.

The sensor body 2 is a device connected to the display controller 4 for calculating a calibration amount (adjustment amount), at which the display surface 3*a* of the liquid crystal display device 3 has preset luminance Lv0 and chromaticity x0, y0, based on a measurement result input from the sensor unit 1. For example, the sensor body 2 obtains a difference between the measurement result Lv, x, y input from the sensor unit 1 and the preset luminance Lv0 and chromaticity x0, y0 as the calibration amount by comparing them. The sensor body 2 is constructed, for example, by a computer such as a personal computer or a microcomputer.

The display controller 4 is a device connected to the liquid crystal display device 3 for calibrating (adjusting) the luminance Lv and the chromaticity x, y on the display surface 3*a* of the liquid crystal display device 3 based on the calibration amount (adjustment amount) input from the sensor body 2 in the example shown in FIGS. 1 and 2.

The sensor unit 1 and the sensor body 2, the sensor body 2 and the display controller 4, and the display controller 4 and the liquid crystal display device 3 are respectively connected, for example, by a USB or the like. The display controller 4 may be constructed to be integral to the sensor body 2 or integral to the liquid crystal display device 3. The sensor body 2 and the display controller 4 may be integrally incorporated into the liquid crystal display device 3.

The sensor unit 1 is further described. The sensor unit 1 includes, for example, an infrared absorbing filter 11, filters 12, silicon photodiodes (SPDs) 13, current-to-voltage conversion circuits (I/V conversion circuits) 14, gain switching circuits 15, an analog-to-digital conversion circuit (A/D conversion circuit) 16, an arithmetic control unit 17, an external interface circuit 18 and a storage 19.

The infrared absorbing filter 11 is an optical filter for transmitting at least visible light and absorbing infrared rays. Since silicon photodiodes are generally sensitive to infrared rays, the infrared absorbing filter 11 is disposed to remove infrared rays to be incident on the silicon photodiodes 13. Thus, the infrared absorbing filter 11 has at least such a cutoff wavelength band as to absorb infrared rays, to which the silicon photodiodes 13 are sensitive.

The filters 12 are color filters, i.e. an X filter 12X, a Y filter 12Y and a Z filter 12Z respectively corresponding to tristimulus values X, Y and Z in so-called CIE color systems. More specifically, the X filter 12X, the Y filter 12Y and the Z filter 12Z are respectively designed to substantially conform to spectral distributions (spectral characteristics) specified, for example, by a color function such as CIE 1931. Alternatively, the X filter 12X, the Y filter 12Y and the Z filter 12Z are respectively designed to substantially conform to the above spectral distributions (spectral characteristics) together with light receiving characteristics of the silicon photodiodes 13X, 13Y and 13Z. The CIE stands for International Commission on Illumination.

For example, the X filter having the spectral distribution corresponding to the stimulus value X permits the passage of the incident light, thereby obtaining a spectrum corresponding to the stimulus value X in the incident light confirming to the spectral distribution corresponding to the stimulus value X. In other words, by passing through the X filter, the incident light is cut out with the spectral distribution corresponding to the stimulus value X and the spectrum corresponding to the stimulus value X is obtained.

In this specification, terms are identified by reference numerals without suffixes in the case of being collectively called while being identified by reference numerals with suffixes in the case of indicating individual constructions.

The silicon photodiodes 13 are photoelectric conversion elements each for generating a current corresponding to the intensity of the received light, and the silicon photodiodes 13X, 13Y and 13Z are disposed in correspondence with the X filter 12X, the Y filter 12Y and the Z filter 12Z.

These infrared absorbing filter 11, filters 12 and silicon photodiodes 13 constitute an XYZ light receiving sensor unit 10*a*, which is, for example, a wide-angle sensor with a wide light receiving angle and including no optical system such as a condenser lens in terms of miniaturization and cost reduction.

The I/V conversion circuits 14 are circuits connected to the silicon photodiodes 13 for converting input currents input from the silicon photodiodes 13 into voltages with voltage values corresponding to the current values of the input currents and outputting the voltages as voltage signals. The I/V conversion circuits 14 are the I/V conversion circuit 14X, the I/V conversion circuit 14Y and the I/V conversion circuit 14Z provided in correspondence with the respective silicon photodiodes 13X, 13Y and 13Z.

The gain switching circuits 15 are amplifying circuits connected to the I/V conversion circuits 14 and the arithmetic control unit 17 for switching their gains (amplification factors) so as to adapt to a dynamic range of the A/D conversion circuit 16 in accordance with a control of the arithmetic control unit 17 and amplifying the voltage signals input from the I/V conversion circuits 14. The gain switching circuits 15 are the gain switching circuits 15X, 15Y and 15Z provided in correspondence with the I/V conversion circuits 14X, 14Y and 14Z.

The A/D conversion circuit 16 is a circuit connected to the gain switching circuits 15 and the arithmetic control unit 17 for converting analog voltage signals input from the gain switching circuits 15 into digital signals having digital values corresponding to the values of the analog voltage signals in accordance with the control of the arithmetic control unit 17.

These I/V conversion circuits 14, gain switching circuits 15 and A/D conversion circuit 16 constitute a signal converter 10*b*, which converts the analog signals output from the XYZ light receiving sensor unit 10*a* into digital signals to be processed in the arithmetic control unit 17.

The storage 19 is a circuit functionally provided with a calibration coefficient storage 19*a* storing calibration coefficients beforehand and a correction coefficient storage 19*b* storing correction coefficients and adapted to store various programs such as a control program for controlling the operation of the sensor unit 1 and various data such as data necessary to execute the various programs and data generated during the execution of the various programs. The calibration coefficient is a coefficient for adjusting measurement values obtained by the XYZ light receiving sensor unit 10*a* to reference values set by reference light source and measuring instrument specified beforehand. For example, single colors of white, red R, green G and blue B of the reference light source adjusted based on a white color of a specified condition (e.g. 6500K, 40 cd/$m^2$, etc.) are measured, and calibration coefficients are obtained by a known usual practice. The correction coefficient is a coefficient for correcting an error caused by the viewing angle dependence of the liquid crystal display device. The storage 19 includes, for example, a volatile storage element such as a RAM (Random Access Memory) which serves as a so-called working memory of the arithmetic control unit 17 and a non-volatile storage element such as a ROM (Read Only Memory) or a rewritable EEPROM (Electrically Erasable Programmable Read Only Memory).

The arithmetic control unit 17 is a circuit including, for example, a CPU (Central Processing Unit) and its peripheral circuits and adapted to control the respective elements of the sensor unit 1 according to their functions and control the operation of the entire sensor unit 1. The arithmetic control unit 17 is functionally provided with a gain controlling section 17*a*, an A/D conversion controlling section 17*b*, an A/D count input section 17*c*, a calculation correcting section 17*d* and a data input/output section 17*e*.

The A/D count input section 17*c* receives the respective digital signals (count values) of the tristimulus values X, Y and Z output from the A/D conversion circuit 16. The gain controlling section 17*a* sets and controls the gains Z, Y and Z of the respective gain switching circuits 15X, 15Y and 15Z based on the respective digital signals (count values) of the tristimulus values X, Y and Z output from the A/D conversion circuit 16. The A/D conversion controlling section 17*b* controls the sampling (sampling timing of the A/D conversion) of the A/D conversion circuit 16. The calculation controlling section 17*d* calibrates and corrects the respective digital signals (count values) of the tristimulus values X, Y and Z based on the calibration coefficients and the correction coefficients stored in the storage 19 and calculates a luminance value Lv and chromaticity values x, y based on the respective digital signals (count values) of the tristimulus values X, Y and Z in accordance with a processing procedure to be described later. The data input/output section 17*e* communicates with the sensor body 2 via the external interface circuit 18.

The external interface circuit 18 is an interface circuit connected to the arithmetic control unit 17 and the sensor body 2 and adapted to transmit and receive communication signals to and from the sensor body 2, and converts the output of the arithmetic control unit 17 into a communication signal of the format receivable by the sensor body 2 and a communication signal received from the sensor body 2 into a data of the format processable by the arithmetic control unit 17.

Next, the operation of the thus constructed liquid crystal display system S is described. For example, in the XYZ light receiving sensor unit 10*a*, light radiated from the display surface 3*a* of the liquid crystal display device 3 is incident as incident light and infrared rays are removed from the incident light by the infrared absorbing filter 11 when the sensor unit 1 is attached to the display surface 3*a* of the liquid crystal display device 3 at the time of calibration. The incident light having the infrared rays removed therefrom is incident on the respective X filter 12X, Y filter 12Y and Z filter 12Z and separated by passing these X filter 12X, Y filter 12Y and Z filter 12Z. These separated beams of light are respectively incident on and received by the silicon photodiodes 13X, 13Y and 13Z to be photoelectrically converted. In this embodiment, the X filter 12X, the Y filter 12Y and the Z filter 12Z are respectively so designed or are respectively so designed together with the silicon photodiodes 13X, 13Y and 13Z as to substantially have the spectral characteristics specified by the color function such as CIE 1931 as described above. Thus, the silicon photodiodes 13 can output the respective values X, Y and Z corresponding to the tristimulus values X, Y and Z and the XYZ light receiving sensor unit 10*a* constitutes a light receiving sensor of the color stimulus value direct reading type which can directly read the stimulus values X, Y and Z.

Currents corresponding to the respective separated beams of light and obtained by photoelectrically converting the respective separated beams of light by the silicon photodiodes 13X, 13Y and 13Z are respectively input to the I/V conversion circuits 14X, 14Y and 14Z as input currents and converted into the respective voltage signals, which are respectively input to the signal A/D conversion circuit 16 via the gain switching circuits 15X, 15Y and 15Z. In the gain switching circuits 15X, 15Y and 15Z, their gains are adjusted to adapt to the dynamic range of the A/D conversion circuit 16 in accordance with gain control signals input from the gain controlling section 17*a* of the arithmetic control unit 17. The gain controlling section 17*a* sets and controls the gains of the gain switching circuits 15 based on the output of the A/D conversion circuit 16. In other words, the gain controlling section 17*a* sets and controls the gain X of the gain switching circuit 15X based on the digital value obtained by converting the analog voltage signal input from the gain switching circuit 15X by the ND conversion circuit 16. The gain controlling section 17*a* similarly sets the gain Y of the gain switching circuit 15Y and the gain Z of the gain switching circuit 15Z. The single A/D conversion circuit 16 has its sampling controlled by the A/D conversion controlling section 17*b* and successively converts the respective voltage signals input from the respective gain switching circuits 15X, 15Y and 15Z into digital signals in a preset specified sampling cycle by a multiplex operation. These respective converted digital signals are output from the A/D conversion circuit 16 to the arithmetic control unit 17 as the digital signals (count values) of the tristimulus values X, Y and Z.

In the arithmetic control unit 17, the respective digital signals (count values) of the tristimulus values X, Y and Z output from the A/D conversion circuit 16 are received by the A/D count input section 17*c* and calibrated and corrected based on the calibration coefficients and the correction coefficients stored in the storage 19 in accordance with the processing procedure to be described later and the luminance value Lv and the chromaticity values x, y are calculated based on the respective digital signals (count values) of the tristimulus values X, Y and Z. Then, the luminance value Lv and the chromaticity values x, y are transmitted to the sensor body 2 via the external interface circuit 18*a* by the data input/output section 17*e*.

In the sensor body 2, when the luminance value Lv and the chromaticity values x, y are input from the sensor unit 1, a calibration amount (adjustment amount) is so calculated based on these measurement results that the display surface 3*a* of the liquid crystal display device 3 has the preset luminance and chromaticity, and the calculated calibration amount is output from the sensor body 2 to the display controller 4. In the display controller 4, when the calibration amount is input from the sensor body 2, a control signal used to calibrate the luminance and chromaticity of the display surface 3*a* of the liquid crystal display device 3 is generated based on this calibration amount and this control signal is output from the display controller 4 to the liquid crystal display device 3. In the liquid crystal display device 3, when this control signal is input, the luminance and chromaticity are calibrated in accordance with this control signal.

Next, a correction process is described. In the correction process, the correction coefficients are first obtained and stored in the correction coefficient storage 19*b* of the storage 19. Then, the display surface 3*a* of the liquid crystal display device 3 as a measurement object is actually measured and the luminance value Lv and the chromaticity values x, y of the display surface 3*a* of the liquid crystal display device 3 are calculated while being corrected by the correction coefficients.

Figure 3:
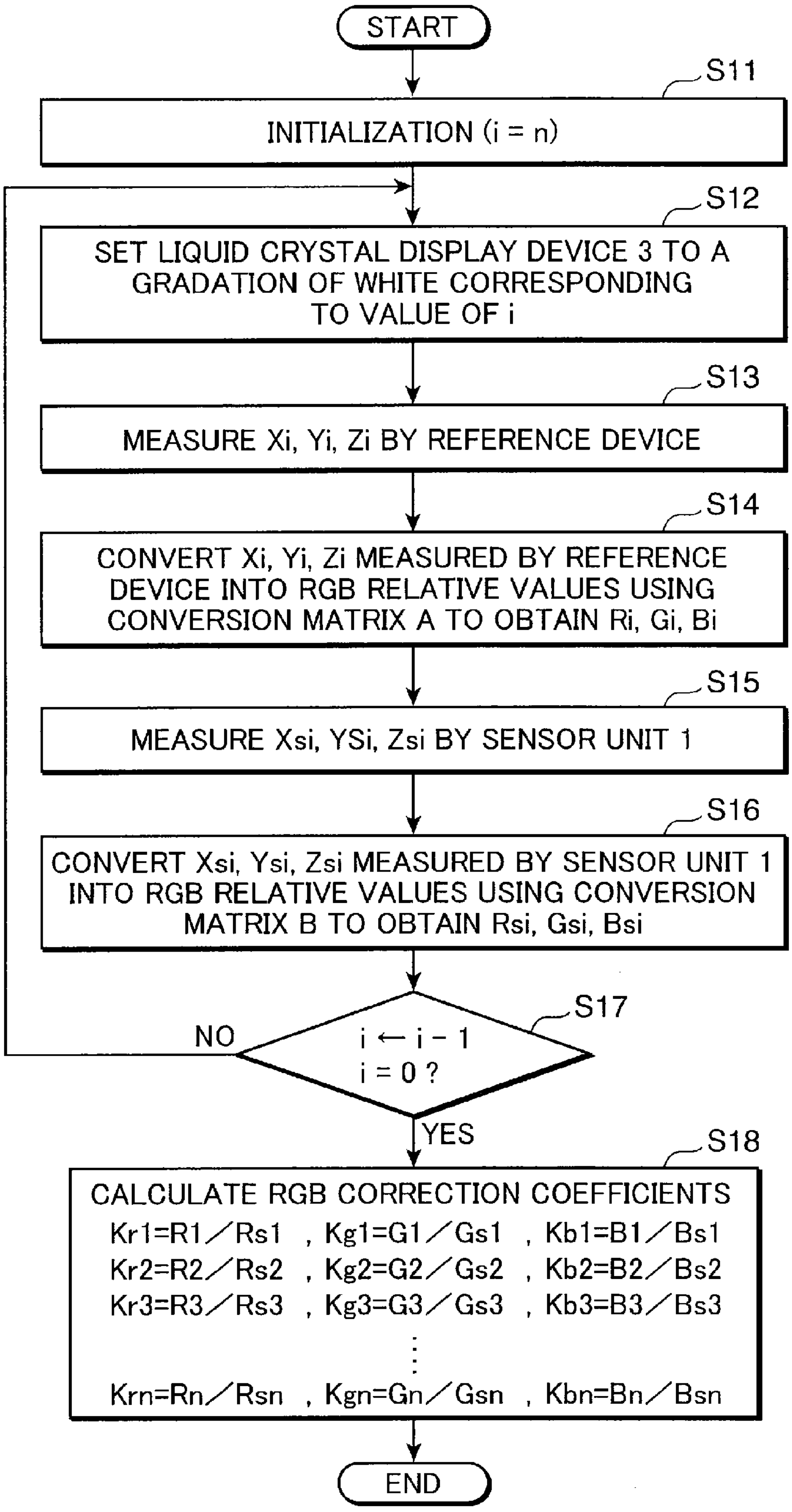
FIG. 3 is a flow chart showing a process for calculating correction coefficients in the liquid crystal display system shown in FIG. 1.
Figure 4:
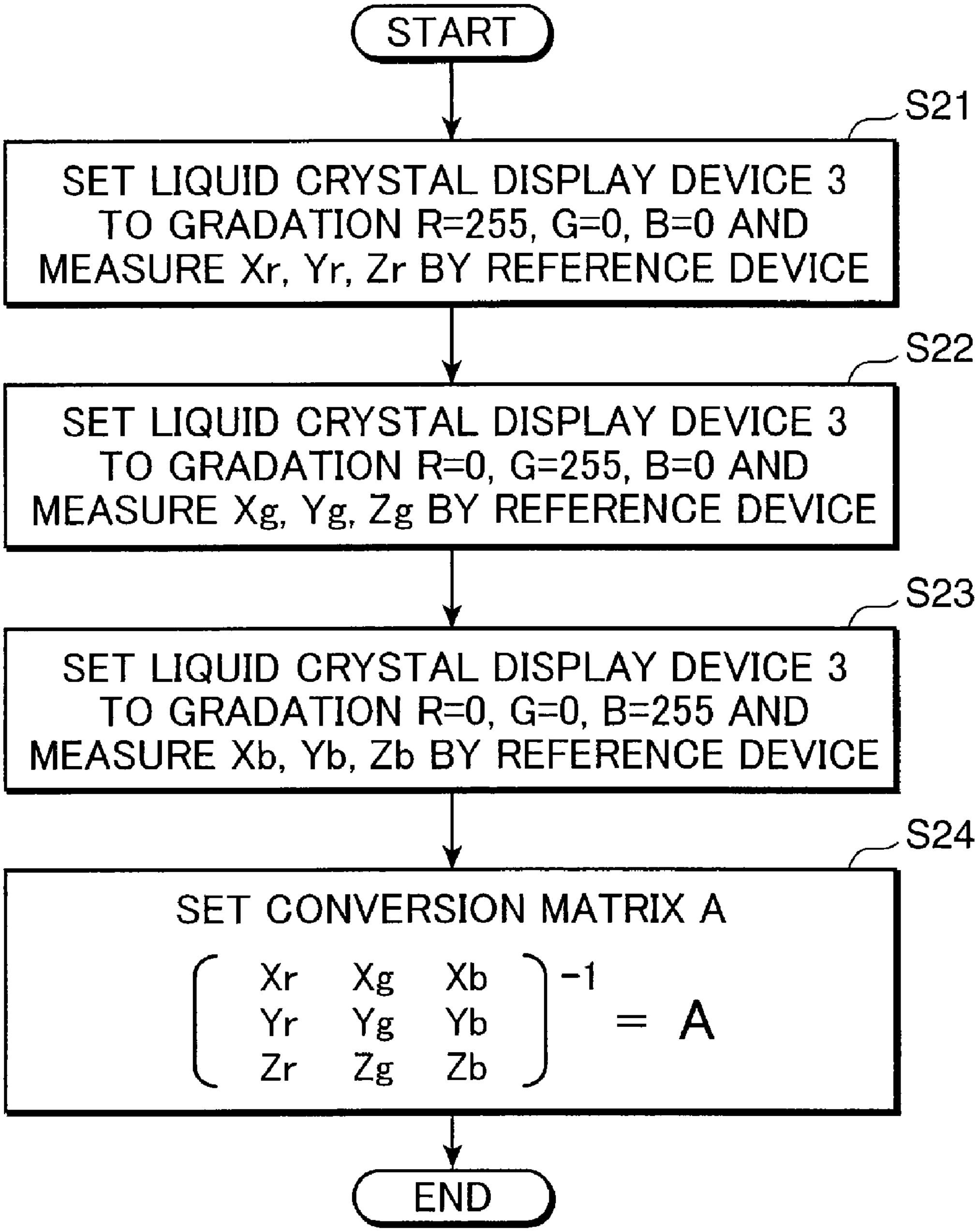
FIG. 4 is a flow chart showing a process for calculating a conversion matrix A for converting tristimulus values X, Y and Z in a reference device into RGB relative values R, G and B in the liquid crystal display system shown in FIG. 1.
Figure 5:
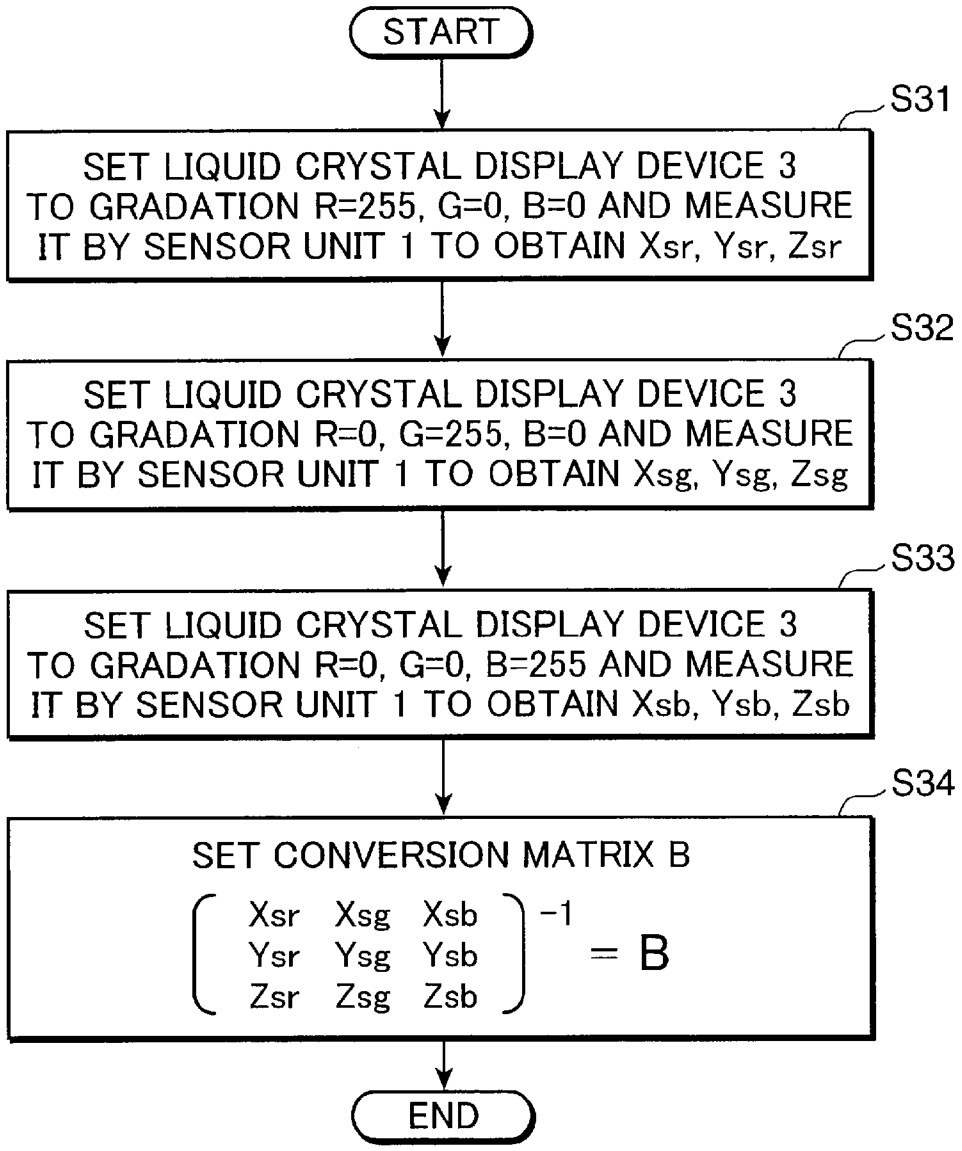
FIG. 5 is a flow chart showing a process for calculating a conversion matrix B for converting tristimulus values X, Y and Z in a sensor unit into RGB relative values R, G and B in the liquid crystal display system shown in FIG. 1.
Figure 7A:
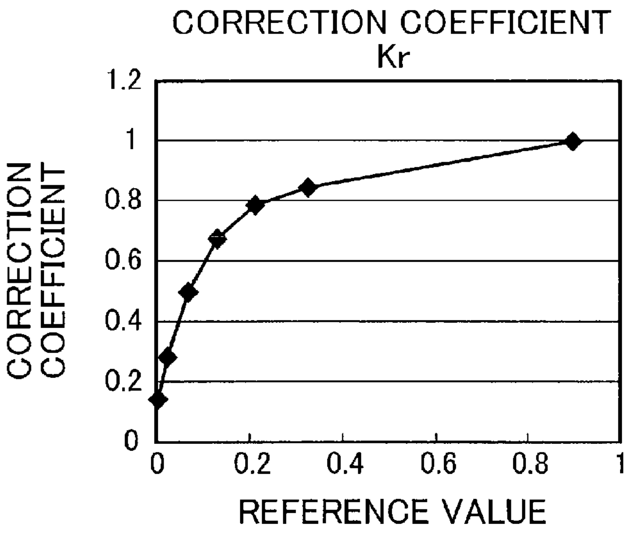
Figure 7B:
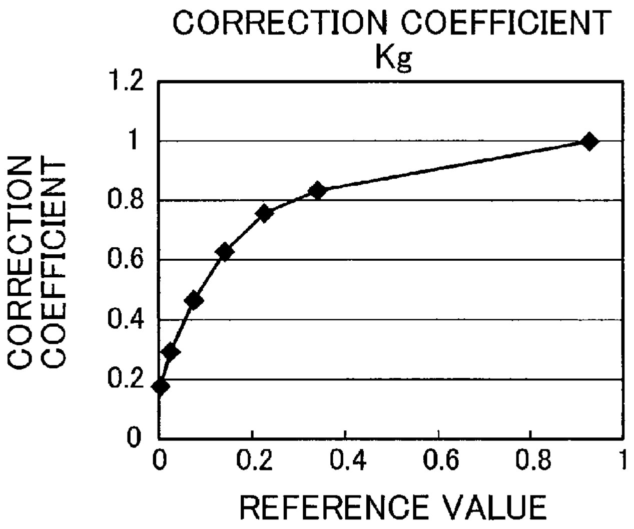
Figure 7C:
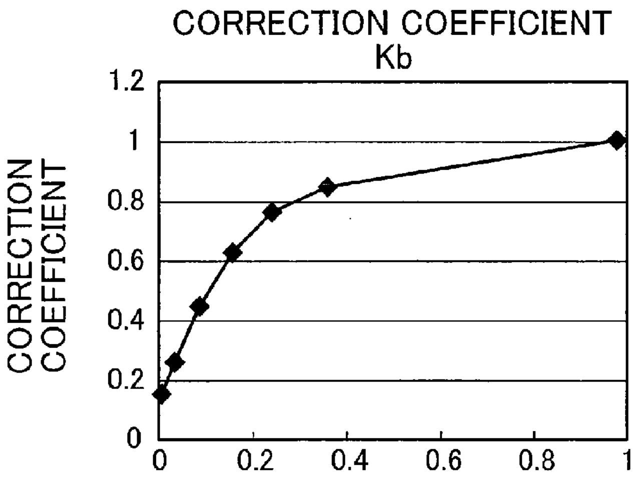
Figure 8:
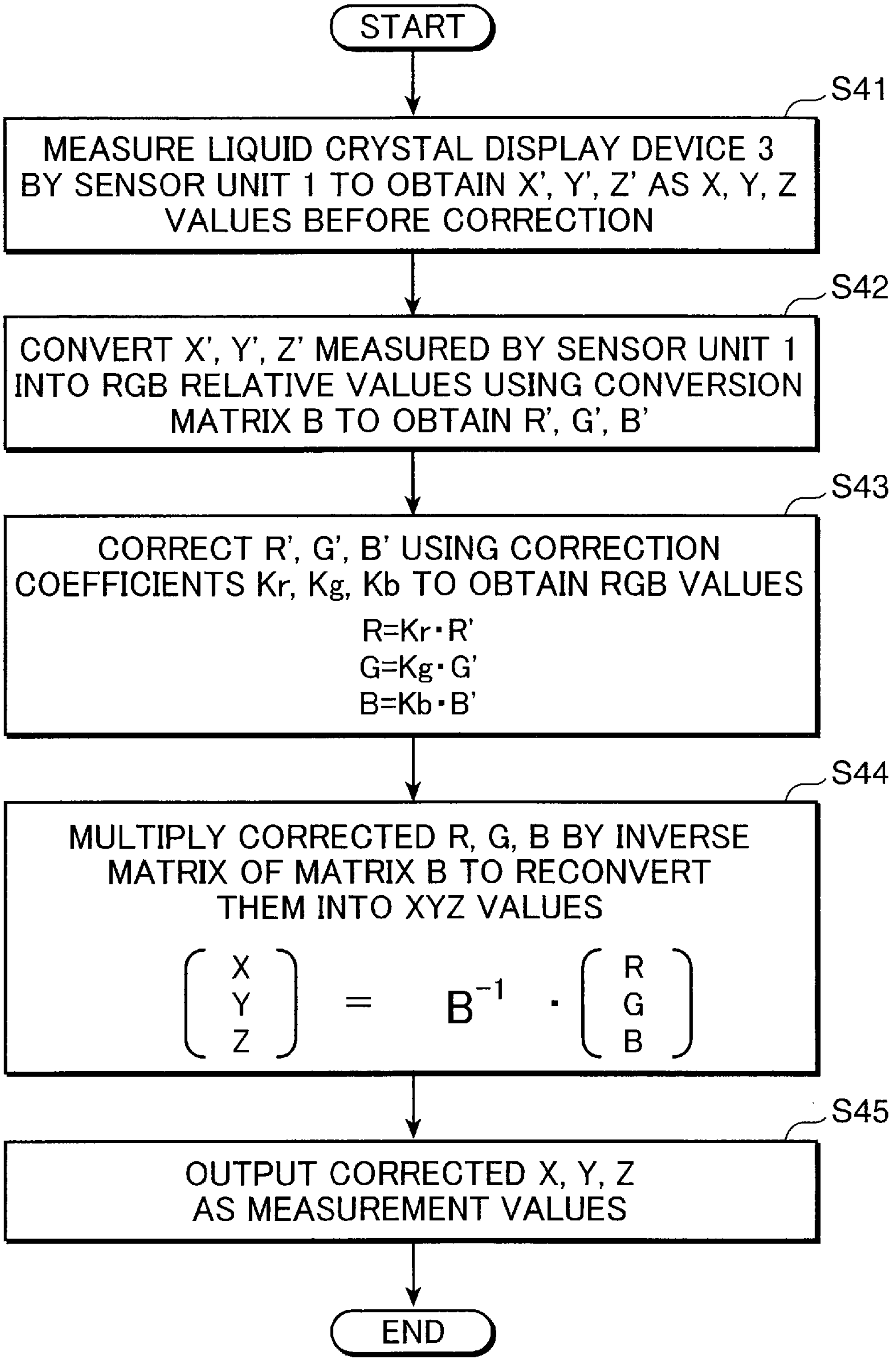
FIG. 8 is a flow chart showing the operation of the sensor unit in the liquid crystal display system shown in FIG. 1.

FIG. 3 is a flow chart showing a process for obtaining the correction coefficients. FIG. 4 is a flow chart showing a process for obtaining a conversion matrix A for converting the tristimulus values X, Y and Z in a reference device into RGB relative values R, G and B. FIG. 5 is a flow chart showing a process for obtaining a conversion matrix B for converting the tristimulus values X, Y and Z in the sensor unit into RGB relative values R, G and B. FIG. 6 is a diagram showing a correction coefficient table in the sensor unit of the first embodiment. FIG. 7 are graphs showing correction coefficient functions. FIG. 7A shows a correction coefficient function Kr of red R, FIG. 7B shows a correction coefficient function Kg of green G and FIG. 7C shows a correction coefficient function Kb of blue B. The respective correction coefficient functions Kr, Kg and Kb are normalized and shown in relative values. FIG. 8 is a flow chart showing the operation of the sensor unit according to the first embodiment.

The correction coefficients are obtained by the following processing procedure. In FIG. 3, initialization is first carried out in Step S11. In this initialization, a loop variable i is initialized and set at a gradation number n (i=n). The gradation number n is that of the liquid crystal display device 3 used to obtain the correction coefficients and, for example, 256. Subsequently, in Step S12, the liquid crystal display device 3 is set at white which is a gradation corresponding to the value of the loop variable i and the above gradation of white is displayed on the display surface 3*a*. Subsequently, in Step S13, the display surface 3*a* of the liquid crystal display device 3 displaying the above gradation of white is measured by the reference device and tristimulus values Xi, Yi and Zi at the loop variable i are measured. This reference device is a telescopic measuring apparatus for measuring a measurement object at a relatively narrow viewing angle from a position relatively distance from the measurement object as in the case of seeing it by human eyes, and capable of outputting tristimulus values X, Y and Z used as references (standards). The suffix i indicates values at the loop variable i, which also holds in the following description. Subsequently, in Step S14, the tristimulus values Xi, Yi and Zi at the loop variable i obtained by the measurement using this reference device are converted into relative values of red R, green G and blue B by the conversion matrix A, whereby RGB relative values Ri, Gi and Bi at the loop variable i are obtained.

Here, the processing procedure for obtaining the conversion matrix A is described. In FIG. 4, in Step S21, the liquid crystal display device 3 is set at a gradation R=255, G=0 and B=0, the display surface 3*a* of the liquid crystal display device 3 displaying this gradation of color is measured by the reference device and tristimulus values Xr, Yr and Zr at the gradation R=255, G=0 and B=0 are measured when the liquid crystal display device 3 is set at a maximum gradation 255. Subsequently, in Step S22, the liquid crystal display device 3 is set at a gradation R=0, G=255 and B=0, the display surface 3*a* of the liquid crystal display device 3 displaying this gradation of color is measured by the reference device and tristimulus values Xg, Yg and Zg at the gradation R=0, G=255 and B=0 are measured. Subsequently, in Step S23, the liquid crystal display device 3 is set at a gradation R=0, G=0 and B=255, the display surface 3*a* of the liquid crystal display device 3 displaying this gradation of color is measured by the reference device and tristimulus values Xb, Yb and Zb at the gradation R=0, G=0 and B=255 are measured. Then, in Step S24, a matrix expressed by Equation (1) is obtained from the tristimulus values Xr, Yr, Zr; Xg, Yg, Zg; Xb, Yb, Zb at these respective gradations and set as the conversion matrix A. By these respective processes in Steps S21 to S24, the conversion matrix A for converting the tristimulus values X, Y and Z measured by the reference device into the RGB relative values R, G and B is obtained.

$$\begin{bmatrix} Xr & Xg & Xb \\ Yr & Yg & Yb \\ Zr & Zg & Zb \end{bmatrix}^{-1} = A \tag{1}$$

Referring back to FIG. 3, in Step S15, the display surface 3*a* of the liquid crystal display device 3 displaying the above gradation of white by the process in Step S12 is measured by the sensor unit 1, whereby tristimulus values Xsi, Ysi and Zsi at the loop variable i are measured. This sensor unit 1 is the one that should store the correction coefficients obtained by this processing procedure. Subsequently, in Step S16, the tristimulus values Xsi, Ysi and Zsi at the loop variable i obtained by the measurement using this sensor unit 1 are converted into relative values of red R, green G and blue B by the conversion matrix B, whereby RGB relative values Rsi, Gsi and Bsi at the loop variable i are obtained.

Here, the processing procedure for obtaining the conversion matrix B is described. In FIG. 5, in Step S31, the liquid crystal display device 3 is set at a gradation R=255, G=0 and B=0, the display surface 3*a* of the liquid crystal display device 3 displaying this gradation of color is measured by the sensor unit 1 and tristimulus values Xsr, Ysr and Zsr at the gradation R=255, G=0 and B=0 are measured when the liquid crystal display device 3 is set at a maximum gradation. Subsequently, in Step S32, the liquid crystal display device 3 is set at a gradation R=0, G=255 and B=0, the display surface 3*a* of the liquid crystal display device 3 displaying this gradation of color is measured by the sensor unit 1 and tristimulus values Xsg, Ysg and Zsg at the gradation R=0, G=255 and B=0 are measured. Subsequently, in Step S33, the liquid crystal display device 3 is set at a gradation R=0, G=0 and B=255, the display surface 3*a* of the liquid crystal display device 3 displaying this gradation of color is measured by the sensor unit 1 and tristimulus values Xsb, Ysb and Zsb at the gradation R=0, G=0 and B=255 are measured. Then, in Step S34, a matrix expressed by Equation (2) is obtained from the tristimulus values Xsr, Ysr, Zsr; Xsg, Ysg, Zsg; Xsb, Ysb, Zsb at these respective gradations and set as the conversion matrix B. By these respective processes in Steps S31 to S34, the conversion matrix B for converting the tristimulus values X, Y and Z measured by the sensor unit 1 into RGB relative values Rs, Gs and Bs is obtained.

$$\begin{bmatrix} Xsr & Xsg & Xsb \\ Ysr & Ysg & Ysb \\ Zsr & Zsg & Zsb \end{bmatrix}^{-1} = B \tag{2}$$

Referring back to FIG. 3, in Step S17, the loop variable i is decremented by one (i←i−1) to obtain the respective values at the next gradation. Then, whether or not the decremented loop variable i is 0 is judged to judge whether or not the respective values corresponding to all the gradations have been obtained. If the loop variable i is 0 (YES) as a result of this judgment, it is judged that the respective values corresponding to all the gradations have been obtained and a process of Step S18 is performed. On the other hand, if the loop variable i is not 0 (NO), this routine returns to Step S12 to obtain the respective values at the next gradation i.

In Step S18, ratios Kri, Kgi and Kbi of the RGB relative values Ri, Gi and Bi in the reference device to the RGB relative values Rsi, Gsi and Bsi in the sensor unit 1 are obtained for the respective gradations i, and these ratios are set as correction coefficients Kri, Kgi and Kbi. In other words, the correction coefficient Kri of red R at the gradation i is obtained by Equation (3-1), the correction coefficient Kgi of green G at the gradation i is obtained by Equation (3-2) and the correction coefficient Kbi of blue B at the gradation i is obtained by Equation (3-3).

$$Kri=Ri/Rsi \tag{3-1}$$

$$Kgi=Gi/Gsi \tag{3-2}$$

$$Kbi=Bi/Bsi \tag{3-3}$$

By this processing procedure, the correction coefficients Kri, Kgi and Kbi at the respective gradations i (i=0, 1, 2, . . . , n) from high luminance (e.g. 256) to low luminance (e.g. 0).

For example, the correction coefficient Kr of red R is a function of a reference value (gradation i), relatively drastically increases from 0 to about 0.843 in a range of the reference value from 0 to about 0.326 and relatively moderately increases from about 0.843 to about 0.997 in a range of the reference value from about 0.326 to about 0.898 as shown in FIG. 7A. The correction coefficient Kg of green G is a function of the reference value (gradation i), relatively drastically increases from 0 to about 0.833 in a range of the reference value from 0 to about 0.340 and relatively moderately increases from about 0.833 to about 0.999 in a range of the reference value from about 0.340 to about 0.929 as shown in FIG. 7B. The correction coefficient Kb of blue B is a function of the reference value (gradation i), relatively drastically increases from 0 to about 0.850 in a range of the reference value from 0 to about 0.359 and relatively moderately increases from about 0.850 to about 1.006 in a range of the reference value from about 0.359 to about 0.978 as shown in FIG. 7C.

The respective correction coefficients Kr, Kg and Kb at the respective gradations obtained by the above processing procedure are stored and saved in the correction coefficient storage 19*b* of the storage 19. The correction coefficients Kr, Kg and Kb may be stored in the form of functions in the correction coefficient storage 19*b* by obtaining functions expressing or approximating profiles shown in FIG. 7, but the correction coefficient table (look-up table format) showing a corresponding relationship between the reference values R, G, B and the correction coefficients Kr, Kg, Kr is stored as shown in FIG. 6 in this embodiment. For example, in the correction coefficient table shown in FIG. 6, the correction coefficient Kr of red R=0.281 when the reference value R of red R=0.0245; the correction coefficient Kg of green G=0.291 when the reference value G of green G=0.0252; and the correction coefficient Kb of blue B=0.261 when the reference value B of blue B=0.0341.

In the case of storing the respective correction coefficients Kr, Kg and Kb in the look-up table format in the correction coefficient storage 19*b*, if a correction coefficient K corresponding to a reference value not found in the correction coefficient table is necessary, this correction coefficient K corresponding to the reference value not found in the correction coefficient table is calculated by an interpolation process using a specified approximation method such as linear approximation or polynomial approximation.

Since the correction coefficients Kr, Kg and Kb are stored in the correction coefficient storage 19*b* beforehand in this embodiment as described above, it is not necessary to obtain the correction coefficients Kr, Kg and Kb anew before the start of an actual measurement of the liquid crystal display device 3 as a measurement object and the actual measurement can be quickly started. Further, the correction coefficients Kr, Kg and Kb can be obtained and stored in the correction coefficient storage 19*b* in the above way at a manufacturer side and users need not conduct a cumbersome measurement of the correction coefficients Kr, Kg and Kb.

Although the measurement and storage of such correction coefficients Kr, Kg and Kb are carried out at the manufacturer side, for example, during production or before shipment in this embodiment, they may be carried out at a user side prior to an actual measurement of the liquid crystal display device 3 as the measurement object. Such measurement and storage at the user side enable a proper handling even when characteristics of the liquid crystal display device 3 change, for example, with time, wherefore more appropriate corrections are possible.

Since such correction coefficients Kr, Kg and Kb generally often differ depending on the type of the liquid crystal display device 3, the liquid crystal display system S may be so constructed that the correction coefficients Kr, Kg and Kb corresponding to the respective types of the liquid crystal display device 3 are stored in a plurality of correction coefficient storages 19*b* of a plurality of storages 19 and suitable correction coefficients Kr, Kg and Kb are selected according to the type of the liquid crystal display device 3 as the measurement object upon an actual measurement of the liquid crystal display device 3 as the measurement object. For example, the liquid crystal display system S is so constructed as to receive a selection instruction from a user via an unillustrated input device in the sensor body 2.

Next, a process for measuring the luminance Lv and the chromaticity x, y on the display surface 3*a* of the liquid crystal display device 3 is described. In FIG. 8, the display surface 3*a* of the liquid crystal display device 3 as the measurement object is first measured to obtain tristimulus values X', Y' and Z' before correction in Step S41. More specifically, when the measurement of the luminance Lv and the chromaticity x, y on the display surface 3*a* of the liquid crystal display device 3 as the measurement object is started, light radiated from the display surface 3*a* of the liquid crystal display device 3 is incident as incident light on the sensor unit 1 and digital signals (count values) of tristimulus values X, Y and Z are output from the A/D conversion circuit 16 by the above respective processes. The respective display surfaces (count values) of these tristimulus values X, Y and Z are received by the A/D count input section 17*c* of the arithmetic control unit 17, and calibrated by the calculation correcting section 17*d* using the calibration coefficients stored in the calibration coefficient storage 19*a* of the storage 19 to obtain the tristimulus values X', Y' and Z' before correction.

Subsequently, in Step S42, the tristimulus values X', Y' and Z' before correction are converted into RGB relative values R', G' and B' by the calculation correcting section 17*d* using the convex matrix B to obtain the RGB relative values R', G' and B'. These respective RGB relative values R', G' and B' are the respective reference values of R, G and B shown in FIGS. 6 and 7.

Subsequently, in Step S43, the converted RGB relative values R', G' and B' are corrected by the calculation correcting section 17*d* using the correction coefficients Kr, Kg and Kb stored in the correction coefficient storage 19*b* of the storage 19. More specifically, the correction coefficient table stored in the correction coefficient storage 19*b* of the storage 19 is searched using the RGB relative value R' as the reference value of red R to obtain the correction coefficient Kr corresponding to the RGB relative value R', and an RGB value R of red R after correction is obtained by multiplying this correction coefficient Kr and the RGB relative value R' (R=KrxR'). Similarly, the correction coefficient table stored in the correction coefficient storage 19*b* of the storage 19 is searched using the RGB relative value G' as the reference value of green G to obtain the correction coefficient Kg corresponding to the RGB relative value G', and an RGB value G of green G after correction is obtained by multiplying the correction coefficient Kg and the RGB relative value G' (G=KgxG'). Similarly, the correction coefficient table stored in the correction coefficient storage 19*b* of the storage 19 is searched using the RGB relative value B' as the reference value of blue B to obtain the correction coefficient Kb corresponding to the RGB relative value B', and an RGB value B of blue B after correction is obtained by multiplying the correction coefficient Kb and the RGB relative value B' (B=Kb×B').

Subsequently, in Step S44, these corrected RGB values R, G and B are converted into tristimulus values X, Y and Z after correction by the calculation correction section 17*d* using an inverse matrix $B^{-1}$ of the conversion matrix B to obtain the tristimulus values X, Y and Z after correction.

Subsequently, in Step S45, the tristimulus values X, Y and Z after correction are output as measurement values from the calculation correction section 17*d*.

The luminance value Lv and the chromaticity values x, y are calculated by the followings Equations (4-1) to (4-3) using the tristimulus values X, Y and Z.

$$x=X/(X+Y+Z) \quad (4\text{-}1)$$

$$y=Y/(X+Y+Z) \quad (4\text{-}2)$$

$$Lv=Y \quad (4\text{-}3)$$

As described above, in the sensor unit 1 of this embodiment, tristimulus values X, Y and Z output from the XYZ light receiving sensor unit 10*a* via the signal converter 10*b* are converted into RGB values of the liquid crystal display device 3 by the calculation correcting section 17*d*, and the RGB values of the liquid crystal display device after this conversion are so corrected by the calculation correcting section 17*d* as to correct an error caused by the viewing angle dependence of the liquid crystal display device 3. Since the RGB values of the liquid crystal display device 3 are corrected in this way, the sensor unit 1 of this embodiment is capable of a more accurate measurement even at a dark gradation. Thus, the liquid crystal display system S of this embodiment can more accurately calibrate the display surface 3*a* of the liquid crystal display device 3 even at a dark gradation.

In this embodiment, the RGB values of the liquid crystal display device after the correction are converted again into the tristimulus values X, Y and Z. Thus, the sensor unit 1 of this embodiment can more accurately measure the tristimulus values X, Y and Z even at a dark gradation.

Although the sensor unit 1 includes the XYZ light receiving sensor unit 10*a* for outputting the tristimulus values X, Y and Z of the CIE color systems in the incident light as the light receiver in the above embodiment, the sensor unit 1 may include a color meter for outputting the RGB values R, G and B in the incident light as the light receiver. By such a construction, the sensor unit 1 can more accurately measure the RGB values even at a dark gradation.

In the above embodiment, the sensor unit 1 may include a spectral radiation luminance meter for outputting first to third spectral radiance luminances corresponding to mutually different first to third spectral distributions as the light receiver. By such a construction, the sensor unit 1 can more accurately measure a spectral radiance luminance at a gradation of a dark part even if including no optical system for restricting a light receiving angle.

A correction process of the sensor unit 1 in the case of using a spectral radiance luminance meter as the light receiver is further described.

Figure 9:
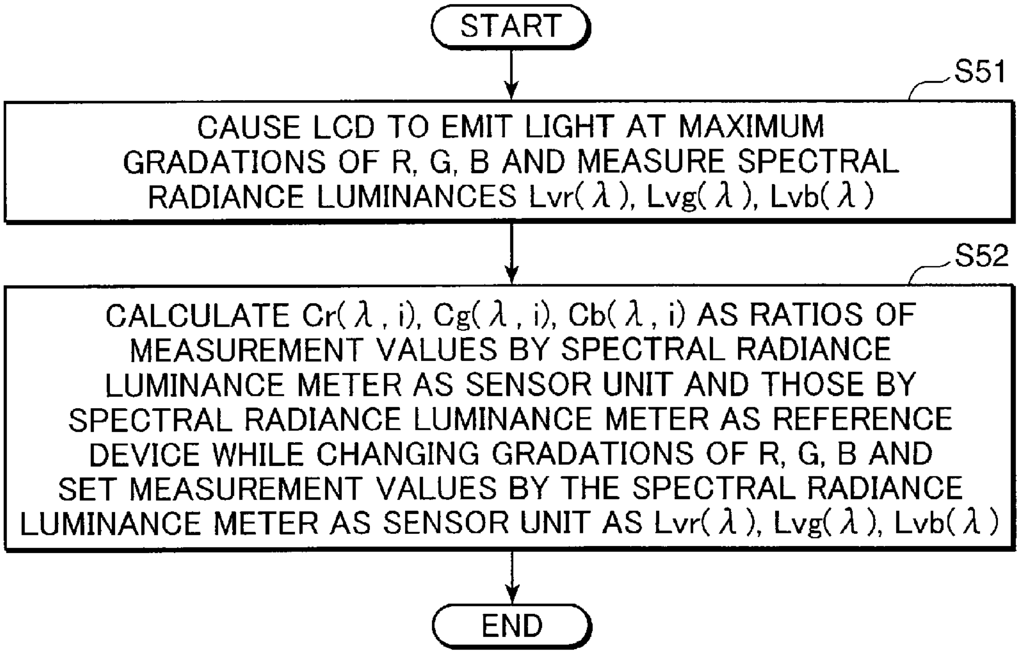
FIG. 9 is a flow chart showing another process for calculating correction coefficients in the liquid crystal display system shown in FIG. 1 in the case of using a spectral radiance luminance meter.
Figure 10:
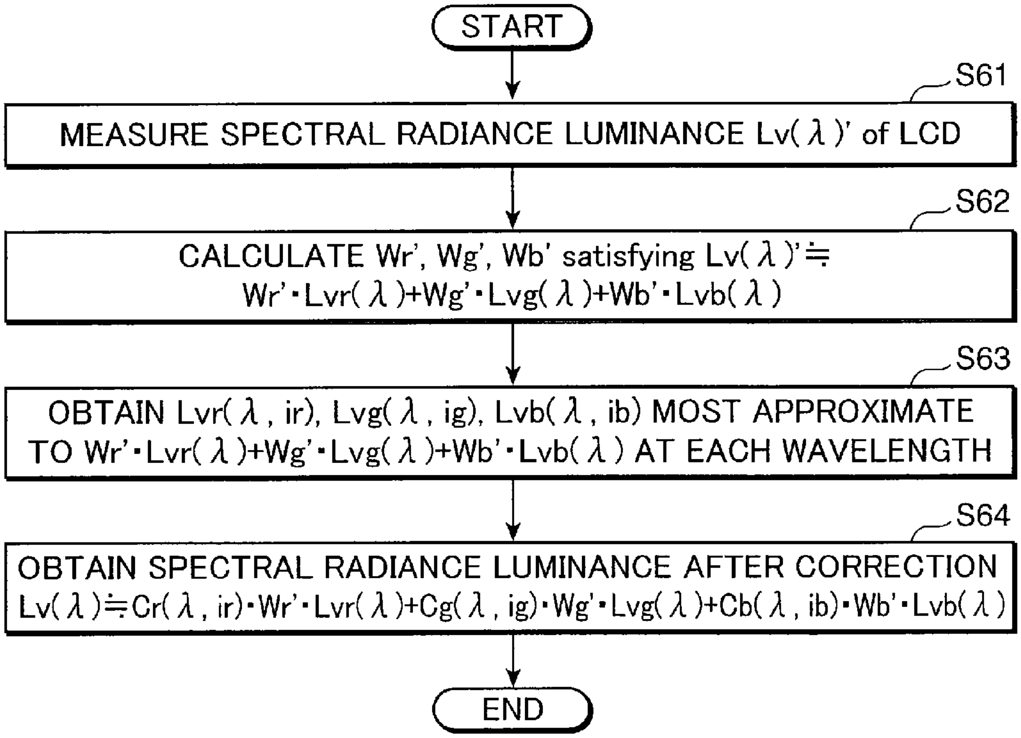
FIG. 10 is a flow chart showing the operation of the sensor unit in the liquid crystal display system shown in FIG. 1 in the case of using the spectral radiance luminance meter.

FIG. 9 is a flow chart showing another process for obtaining correction coefficients in the case of using the spectral radiance luminance meter. FIG. 10 is a flow chart showing the operation of the sensor unit in the case of using the spectral radiance luminance meter.

First of all, a processing procedure for obtaining correction coefficients Cr(λ, p), Cg(λ, p) and Cb(λ, p) is described. In FIG. 9, in Step S51, the liquid crystal display device 3 is caused to emit light at maximum gradations of red R, green G and blue B and spectral radiance luminances Lvr(λ), Lvg(λ) and Lvb(λ) are measured by the spectral radiance luminance meter as a reference device. More specifically, this process is similar to the one shown in the flow chart of FIG. 4. First of all, the liquid crystal display device 3 is set at a gradation R=255, G=0 and B=0, the display surface 3*a* of the liquid crystal display device 3 displaying this gradation of color is measured by the reference device and the spectral radiance luminance Lvr(λ) at the gradation R=255, G=0 and B=0 is measured when the liquid crystal display device 3 is set at a maximum gradation 255. Subsequently, the liquid crystal display device 3 is set at a gradation R=0, G=255 and B=0, the display surface 3*a* of the liquid crystal display device 3 displaying this gradation of color is measured by the reference device and a spectral radiance luminance Lvg(λ) at the gradation R=0, G=255 and B=0 is measured. Subsequently, the liquid crystal display device 3 is set at a gradation R=0, G=0 and B=255, the display surface 3*a* of the liquid crystal display device 3 displaying this gradation of color is measured by the reference device and a spectral radiance luminance Lvb(λ) at the gradation R=0, G=0 and B=255 is measured.

In Step S52, the gradations of red R, green G and blue B corresponding to i are successively changed, the measurement values Lvr(λ, i), Lvg(λ, i) and Lvb(λ, i) obtained by the spectral radiance luminance meter as the sensor unit 1 and measurement values Lv0r(λ, i), Lv0g(λ, i) and Ly0b(λ, i) obtained by the spectral radiance luminance meter as the reference device are obtained and ratios Cr(λ, i), Cg(λ, i) and Cb(λ, i) of these measurement values obtained by the spectral radiance luminance meter as the sensor unit 1 and those obtained by the spectral radiance luminance meter as the reference device are obtained as correction coefficients. More specifically, this process is similar to the one shown in the flow chart of FIG. 3. First of all, initialization is first carried out to initialize the loop variable i, and the loop variable i is set at a gradation number n (i=n). Subsequently, the liquid crystal display device 3 is set to a single color of R, G or B at a gradation corresponding to the value of the loop variable i, and the single color of this gradation of R, G or B is displayed on the display surface 3*a*. Subsequently, the display surface 3*a* of the liquid crystal display device 3 displaying the single color of the above gradation is measured by the spectral radiance luminance meter as the reference device to measure the spectral radiance luminances Lv0ri(λ, i), Lv0gi(λ,i) and Lv0bi(λ, i) at the loop variable i. Subsequently, the display surface 3*a* of the liquid crystal display device 3 displaying the above gradation of white is measured by the spectral radiance luminance meter as the sensor unit 1 to measure the spectral radiance luminances Lvri(λ, i), Lvgi(λ, i) and Lvbi(λ, i) at the loop variable i. Subsequently, the loop variable i is decremented by one to obtain the respective values corresponding to the next gradation (i←i−1). Then, whether or not the decremented loop variable i is 0 is judged to judge whether or not the respective values corresponding to all the gradations have been obtained. If the loop variable i is not 0 (NO) as a result of this judgment, this routine returns to the process after the initialization to obtain the respective values at the next gradation i. On the other hand, if the loop variable i is 0 (YES), it is judged that the respective values corresponding to all the gradations have been obtained and correction coefficients Cri(λ, i), Cgi(λ, i) and Cbi(λ, i) are obtained. Specifically, the ratios of the spectral radiance luminances Lyri(λ, i), Lvgi(λ, i) and Lvbi(λ, i) in the sensor unit 1 to the spectral radiance luminances Lv0ri(λ, i), Lv0gi(λ, i) and Ly0bi(λ, i) in the reference device are obtained for each gradation i and these ratios are set as the correction coefficients Cri(λ, i), Cgi(λ, i) and Cbi(λ, i). In other words, the correction coefficient Cri(λ, i) of red R at the gradation i is obtained by Equation (5-1), the correction coefficient Cgi(λ, i) of green G at the gradation i is obtained by Equation (5-2) and the correction coefficient Cbi(λ, i) of blue B at the gradation i is obtained by Equation (5-3).

$$Cri(\lambda,i)=Lyri(\lambda,i)/Lv0ri(\lambda,i) \quad (5\text{-}1)$$

$$Cgi(\lambda,i)=Lvgi(\lambda,i)/Lv0gi(\lambda,i) \quad (5\text{-}2)$$

$$Cbi(\lambda,i)=Lvbi(\lambda,i)/Lv0bi(\lambda,i) \quad (5\text{-}3)$$

By this processing procedure, the correction coefficients Cri(λ, i), Cgi(λ, i) and Cbi(λ, i) at the respective gradations i (i=0, 1, 2, . . . , n) from high luminance (e.g. 256) to low luminance (e.g. 0) are obtained.

The respective correction coefficients Cri(λ, i), Cgi(λ, i) and Cbi(λ, i) at each gradation obtained by the above processing procedure are stored, for example, in a table format in the correction coefficient storage 19*b* of the storage 19.

Next, the process for measuring the luminance Lv and the chromaticity x, y on the display surface 3*a* of the liquid crystal display device 3 is described. In FIG. 10, the display surface 3*a* of the liquid crystal display device 3 as the measurement object is first measured to obtain a spectral radiance luminance Lv(λ) before correction in Step S61. Subsequently, in Step S62, such coefficients Wr', Wg' and Wb' as to make Wr'·Lvr(λ)+Wg'·Lvg(λ)+Wb'·Lvb(λ) substantially equal to this spectral radiance luminance Lv(λ)' before correction (most approximate to this spectral radiance luminance Lv(λ)' before correction) are obtained by the calculation correcting section 17*d*. Wr', Wg' and Wb' correspond to gradations of R, G and B. Subsequently, in Step S63, Lvr(λ, ir), Lvg(λ, ig) and Lvb(λ, ib) substantially equal to We·Lvr(·), Wg'·Lvg(λ) and Wb'·Lvb(λ) at each wavelength λ (most approximate to Wr'·Lvr(λ), Wg'·Lvg(λ) and Wb'·Lvb(λ) at each wavelength λ) are obtained by the calculation correcting section 17*d*. In Step S64, Cr(λ, ir)·Wr'·Lvr(λ)+Cg(λ, ig)·Wg'·Lvg(λ)'Cb(λ, ib)·Wb'·Lvb(λ) (=Lv(λ)) is obtained as the spectral radiance luminance Lv(X) after correction by the calculation correcting section 17*d*.

By such an operation, the sensor unit 1 can more accurately measure the spectral radiance luminance Lv(λ) in a dark gradation region even without an optical system for restricting a light receiving angle.

This specification discloses the aforementioned arrangements. The following is a summary of the primary arrangements of the embodiments.

A color measuring apparatus according to one aspect is for measuring the luminance or color of a liquid crystal color display and comprises a light receiver for receiving radiant light from the liquid crystal color display at a specified first viewing angle and outputting intensity signals corresponding to at least three mutually different spectral responsivities; a converter for converting the respective intensity signals output from the light receiver into information on a plurality of primary color intensities of the liquid crystal color display; and a corrector for correcting the intensity signals by the first viewing angle to signal intensities by a specified second viewing angle based on the information on the primary color intensities and prestored conversion coefficients of respective primary colors specific to the liquid crystal color display.

In the color measuring apparatus of this construction, the respective intensity signals output from the light receiver and corresponding to the at least three mutually different spectral responsivities are converted into the information on the plurality of primary color intensities of the liquid crystal color display by the converter, and the intensity signals by the first viewing angle are corrected to signal intensities by the second viewing angle by the corrector. Since the color measuring apparatus corrects the intensity signals by the first viewing angle to the signal intensities by the second viewing angle in this way, a more accurate measurement is possible even at a dark gradation.

According to another aspect, in the above color measuring apparatus, a correction coefficient storage storing the conversion coefficients of the respective primary colors specific to the liquid crystal color display beforehand is further provided; and the corrector corrects the intensity signals by the first viewing angle to signal intensities by the second viewing angle using the conversion coefficients in the correction coefficient storage.

According to this construction, since the conversion coefficients are stored in the correction coefficient storage beforehand, the color measuring apparatus of this construction can quickly start an actual measurement without needing to obtain the conversion coefficients before the start of the actual measurement of the liquid crystal color display as a measurement object. It is also possible to obtain the conversion coefficients and store them in the correction coefficient storage at a manufacturer side, whereby users need not conduct a cumbersome measurement of the conversion coefficients.

According to another aspect, in the above color measuring apparatuses, the light receiver includes an optical filter on which the radiant light is incident and which emit beams of light corresponding to the at least three mutually different spectral responsivities, and a light receiving circuit for receiving the respective beams of light emitted from the optical filter and outputting the intensity signals corresponding to the at least three mutually different spectral responsivities.

According to this construction, there is provided the color measuring apparatus comprising the light receiver with the optical filter and the light receiving circuit.

According to another aspect, in the above color measuring apparatuses, the light receiver is a color meter for outputting tristimulus values of the CIE color systems in the incident light and further includes a tristimulus value converter for converting the signal intensities by the second viewing angle obtained by the correction in the corrector into tristimulus values of the CIE color systems.

According to this construction, tristimulus values can be more accurately measured even at a dark gradation.

According to another aspect, in the above color measuring apparatuses, the light receiver is a color meter for outputting RGB values in incident light.

According to this construction, RGB values can be more accurately measured even at a dark gradation.

According to another aspect, in the above color measuring apparatuses, the light receiver is a spectral radiance luminance meter for outputting first to third spectral radiance luminances of incident light corresponding to mutually different first to third spectral distributions.

According to this construction, the color measuring apparatus can more accurately measure spectral radiance luminances even at a dark gradation.

A color measuring apparatus according to another aspect is for measuring the color of a liquid crystal color display, and comprises a light receiver to be disposed in contact with a display surface of the liquid crystal color display for receiving radiant light from the liquid crystal color display and outputting intensity signals corresponding to at least three mutually different spectral responsivities; a converter for converting the respective intensity signals output from the light receiver into a plurality of control signals used to show a display on the liquid crystal color display; and a corrector for correcting the plurality of control signals to cancel the viewing angle dependency of the liquid crystal color display based on conversion coefficients stored beforehand.

According to this construction, the color measuring apparatus can more accurately measure spectral radiance luminances even at a dark gradation.

According to another aspect, the above color measuring apparatus is connected to a display controller of the liquid crystal color display and further comprises an output section for outputting the plurality of control signals corrected in the corrector to the display controller of the liquid crystal color display, and the display controller controls the display of the liquid crystal color display based on the plurality of control signals.

According to this construction, a display surface of a liquid crystal display device can be more accurately calibrated even at a dark gradation.

A color measuring method according to another aspect of the present invention is for measuring the luminance or color of a liquid crystal color display and comprises a light receiving step of receiving radiant light from the liquid crystal color display at a specified first viewing angle and outputting intensity signals corresponding to at least three mutually different spectral responsivities; a converting step of converting the respective intensity signals in the light receiving step into information on a plurality of primary color intensities of the liquid crystal color display; and a correcting step of correcting the intensity signals by the first viewing angle to signal intensities by a specified second viewing angle based on the information on the primary color intensities and prestored conversion coefficients of respective primary colors specific to the liquid crystal color display.

According to the measuring method with the above construction, the respective intensity signals obtained by receiving the radiant light from the liquid crystal color display and corresponding to the at least three mutually different spectral responsivities are converted into the information on the plurality of primary color intensities of the liquid crystal color display, and the intensity signals by the first viewing angle are corrected to the signal intensities by the second viewing angle based on the information on the primary color intensities and the prestored conversion coefficients of the respective primary colors specific to the liquid crystal color display.

Since the intensity signals by the first viewing angle are corrected to the signal intensities by the second viewing angle in this color measuring method, a more accurate measurement is possible even at a dark gradation.

According to another aspect, a liquid crystal display system comprises a color measuring apparatus for measuring color on a display surface of a liquid crystal display device and a display controller for calibrating the color on the display surface of the liquid crystal display device based on a measurement result of the color measuring apparatus, wherein the color measuring apparatus is any one of the above color measuring apparatuses.

The liquid crystal display system with the above construction can more accurately calibrate the display surface of the liquid crystal display device even at a dark gradation.

The present invention has been appropriately and fully described above by way of the embodiment with reference to the drawings to express the present invention. It should be appreciated that a person skilled in the art can easily modify and/or improve the above embodiment. Thus, unless a modification or improvement made by a person skilled in the art departs from the scope as claimed, such a modification or improvement is construed to be included in the scope as claimed.

What is claimed is:

1. A color measuring apparatus for measuring the luminance or color of a liquid crystal color display, comprising:

a light receiver for receiving radiant light from the liquid crystal color display at a specified first viewing angle and outputting intensity signals corresponding to at least three mutually different spectral responsivities;

a converter for converting the respective intensity signals output from the light receiver into information on a plurality of primary color intensities of the liquid crystal color display; and a corrector for correcting the intensity signals by the first viewing angle to signal intensities by a specified second viewing angle based on the information on the primary color intensities and prestored conversion coefficients of respective primary colors specific to the liquid crystal color display.

2. A color measuring apparatus according to claim 1, further comprising a correction coefficient storage storing the conversion coefficients of the respective primary colors specific to the liquid crystal color display beforehand, wherein the corrector corrects the intensity signals by the first viewing angle to signal intensities by the second viewing angle using the conversion coefficients in the correction coefficient storage.

3. A color measuring apparatus according to claim 1, wherein the light receiver includes:

an optical filter on which the radiant light is incident and which emit beams of light corresponding to the at least three mutually different spectral responsivities; and a light receiving circuit for receiving the respective beams of light emitted from the optical filter and outputting the intensity signals corresponding to the at least three mutually different spectral responsivities.

4. A color measuring apparatus according to claim 1, wherein the light receiver is a color meter for outputting tristimulus values of the CIE color systems in incident light and includes a tristimulus value converter for converting the signal intensities by the second viewing angle obtained by the correction in the corrector into tristimulus values of the CIE color systems.

5. A color measuring apparatus according to claim 1, wherein the light receiver is a color meter for outputting RGB values in incident light.

6. A color measuring apparatus according to claim 1, wherein the light receiver is a spectral radiance luminance meter for outputting first to third spectral radiance luminances of incident light corresponding to mutually different first to third spectral distributions.

7. A color measuring apparatus for measuring the color of a liquid crystal color display, comprising:

a light receiver to be disposed in contact with a display surface of the liquid crystal color display for receiving radiant light from the liquid crystal color display and outputting intensity signals corresponding to at least three mutually different spectral responsivities;

a converter for converting the respective intensity signals output from the light receiver into a plurality of control signals used to show a display on the liquid crystal color display; and a corrector for correcting the plurality of control signals to cancel the viewing angle dependency of the liquid crystal color display based on conversion coefficients stored beforehand.

8. A color measuring apparatus according to claim 7, wherein:

the color measuring apparatus is connected to a display controller of the liquid crystal color display and further comprises an output section for outputting the plurality of control signals corrected in the corrector to the display controller of the liquid crystal color display; and the display controller controls the display of the liquid crystal color display based on the plurality of control signals.

9. A color measuring method for measuring the luminance or color of a liquid crystal color display, comprising:

a light receiving step of receiving radiant light from the liquid crystal color display at a specified first viewing angle and outputting intensity signals corresponding to at least three mutually different spectral responsivities;

a converting step of converting the respective intensity signals in the light receiving step into information on a plurality of primary color intensities of the liquid crystal color display; and a correcting step of correcting the intensity signals by the first viewing angle to signal intensities by a specified second viewing angle based on the information on the primary color intensities and prestored conversion coefficients of respective primary colors specific to the liquid crystal color display.

10. A liquid crystal display system, comprising:

a color measuring apparatus for measuring color on a display surface of a liquid crystal color display; and a display controller for the liquid crystal display device, wherein the color measuring apparatus includes:

a light receiver for receiving radiant light from the liquid crystal color display at a specified first viewing angle and outputting intensity signals corresponding to at least three mutually different spectral responsivities;

a converter for converting the respective intensity signals output from the light receiver into information on a plurality of primary color intensities of the liquid crystal color display; and a corrector for correcting the intensity signals by the first viewing angle to signal intensities by a specified second viewing angle based on the information on the primary color intensities and prestored conversion coefficients of respective primary colors specific to the liquid crystal color display, and the display controller controls the color on the display surface of the liquid crystal color display based on a measurement result of the color measuring apparatus.

* * * * *